(12) United States Patent
Luo et al.

(10) Patent No.: US 10,224,387 B2
(45) Date of Patent: Mar. 5, 2019

(54) DISPLAY PANEL AND DISPLAY DEVICE

(71) Applicant: BOE TECHNOLOGY GROUP CO., LTD., Beijing (CN)

(72) Inventors: Chengyuan Luo, Beijing (CN); Chang Yen Wu, Beijing (CN); Wei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/841,573

(22) Filed: Dec. 14, 2017

(65) Prior Publication Data
US 2018/0301524 A1 Oct. 18, 2018

(30) Foreign Application Priority Data

Apr. 14, 2017 (CN) .................... 2017 2 0391935 U (51) Int. Cl.
*H01L 27/32* (2006.01)
*H01L 33/48* (2010.01)
(52) U.S. Cl.
CPC .......... *H01L 27/3297* (2013.01); *H01L 27/32* (2013.01); *H01L 27/3253* (2013.01); *H01L 27/3276* (2013.01); *H01L 27/3288* (2013.01); *H01L 33/48* (2013.01)
(58) Field of Classification Search
CPC . H01L 27/32; H01L 27/3225; H01L 27/3237; H01L 27/3241; H01L 27/3244; H01L 27/3248; H01L 27/3251; H01L 27/3253; H01L 27/3276; H01L 27/3288; H01L 27/3297
See application file for complete search history.

(56) References Cited

U.S. PATENT DOCUMENTS

| 8,258,523 | B2* | 9/2012 | Lee ...................... H01L 27/3276 257/88 |
| RE44,657 | E * | 12/2013 | Miyake .................... G09G 3/20 257/E21.461 |
| 9,780,327 | B2* | 10/2017 | Choi .................... H01L 51/5246 |
| 9,834,435 | B1* | 12/2017 | Liu ........................ B81B 7/0058 |

(Continued)

FOREIGN PATENT DOCUMENTS

| CN | 104505465 A | 4/2015 |
| CN | 104505470 A | 4/2015 |

*Primary Examiner* — Eduardo A Rodela
(74) *Attorney, Agent, or Firm* — Calfee, Halter & Griswold LLP (57) ABSTRACT

A display panel includes a first substrate, a second substrate, an OLED device, a first connection structure and a second connection structure. The second substrate is arranged opposite to the first substrate and includes a display area and a peripheral area. The OLED device is arranged between the second substrate and the first substrate. The first connection structure is arranged between the second substrate and the first substrate and is connected with the second substrate and the first substrate, and the first connection structure is located at the peripheral area to surround the OLED device. The second connection structure is arranged between the second substrate and the first substrate and is connected with the second substrate and the first substrate, and the second connection structure is located at the peripheral area and is far away from the display area than the first connection structure.

7 Claims, 7 Drawing Sheets

(56) References Cited

U.S. PATENT DOCUMENTS

| | | | |
|---|---|---|---|
| 9,937,698 B2* | 4/2018 | Yasumoto | B32B 43/006 |
| 2007/0170605 A1* | 7/2007 | Lee | H01L 51/5246 |
| | | | 264/1.1 |
| 2010/0148209 A1* | 6/2010 | Hatano | H01L 51/003 |
| | | | 257/99 |
| 2015/0041772 A1* | 2/2015 | Han | H01L 27/3248 |
| | | | 257/40 |
| 2015/0069358 A1* | 3/2015 | Chida | H01L 51/5246 |
| | | | 257/40 |
| 2015/0171155 A1* | 6/2015 | Yun | H01L 51/5243 |
| | | | 257/40 |

* cited by examiner

DISPLAY PANEL AND DISPLAY DEVICE

CROSS REFERENCE TO RELATED APPLICATIONS

This application claims the priority to and the benefit of Chinese Patent Application No. 201720391935.6, filed on Apr. 14, 2017, which is incorporated herein by reference in its entirety.

TECHNICAL FIELD

The disclosure relates to a display technical field, in particular, to a display panel and a display device having the display panel.

BACKGROUND

Active matrix organic light-emitting diode (AMOLED) has gradually attracted widespread attention due to realization of a higher color gamut, ultra-thin and flexible display. Among them, curve Organic Light-Emitting Diodes (OLEDs) and flexible OLEDs are typically common, and are highly appreciated by many users because of unique function and excellent user experience thereof. However, OLED devices are easily corroded by water vapor and oxygen, and organic materials and metal electrodes can easily react with water and oxygen to deactivate the devices, so that it is generally required to package the devices to prolong its service life.

Packaging the OLED devices by using resin adhesive material is a traditional packaging method, which has advantages of simple manufacturing process, better packaging effect, and also little stress after curing, thusly avoiding appearance of cracks, so that such packing method can be used for manufacturing the large-size devices. However, since substrates used in the conventional devices are substantially glass substrates, a connection between the resin adhesive and the glass substrates presents limitation to easily cause stripping at the four corners, especially loosen adhesive will occur at the four corners packaged of the device, during after-cutting, processing, conveying, assembling and the like. Therefore, it is extremely important to reinforce the package structure without affecting performance of the devices.

The information as above disclosed in the Background are merely employed to enhance understanding of background of this disclosure.

SUMMARY

A main object of the present disclosure is to overcome at least one of the above existing defects. A display panel is provided to improve firmness of the display panel and prevent occurrence of loosen adhesive.

Another main object of the present disclosure is to overcome at least one of the above existing defects. A display device is provided to improve firmness of the display panel in the display device, to further improve the firmness of the display device.

To achieve the above objects, the present disclosure employs the following technical solutions:

One aspect according to the present disclosure provides a display panel, wherein the display panel includes a first substrate, a second substrate, an OLED device, a first connection structure and a second connection structure. The second substrate is arranged opposite to the first substrate. The display panel includes a display area and a peripheral area around the display area. The OLED device is arranged between the second substrate and the first substrate, and the OLED device is arranged in the display area. The first connection structure is arranged between the second substrate and the first substrate and is connected with the second substrate and the first substrate, and the first connection structure is located at the peripheral area to surround the OLED device. The second connection structure is arranged between the second substrate and the first substrate and is connected with the second substrate and the first substrate, and the second connection structure is located at the peripheral area and far away from the display area than the first connection structure.

Another aspect according to the present disclosure provides a display device including a display panel, wherein the display panel includes a first substrate, a second substrate, an OLED device, a first connection structure and a second connection structure. The second substrate is arranged opposite to the first substrate. The display panel includes a display area and a peripheral area around the display area. The OLED device is arranged between the second substrate and the first substrate, and the OLED device is arranged in the display area. The first connection structure is arranged between the second substrate and the first substrate and is connected with the second substrate and the first substrate, and the first connection structure is located at the peripheral area to surround the OLED device. The second connection structure is arranged between the second substrate and the first substrate and is connected with the second substrate and the first substrate, and the second connection structure is located at the peripheral area and far away from the display area than the first connection structure.

BRIEF DESCRIPTION OF THE DRAWINGS

The foregoing aspects, features and advantages of the present disclosure will become more apparent from the following detailed description thereof when taken in conjunction with the accompanying drawings. The companying drawings are merely illustrative but not necessarily to scale. Wherever possible, the same reference numbers will be used throughout the drawings to refer to the same or like parts. In which.

Among them, the reference numbers are listed as follows:

1. glass substrate; 2. first connection structure; 3. second connection structure.

DETAILED DESCRIPTION

Exemplary implementations will now be described sufficiently with reference to the accompanying drawings. However, the exemplary implementations can be carried out in variety of forms, but should not be construed as limiting the embodiments set forth herein. Rather, these implementations are provided such that this disclosure will be thorough and complete, and will transmit concepts of the exemplary implementations completely to those skilled in the art. The same reference numbers in the drawings serve to denote the same or similar structures, and accordingly their detailed descriptions will be omitted.

Figure 1:
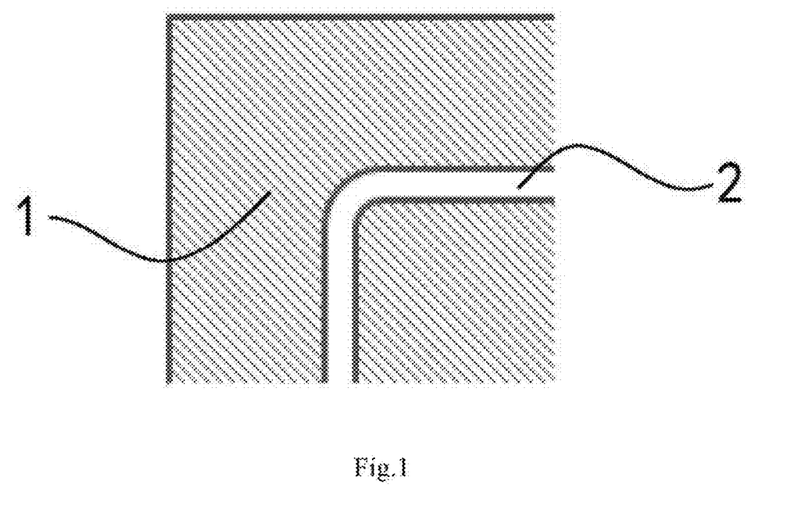
FIG. 1 is a schematic structural view of a display panel in the prior art.
Figure 2:
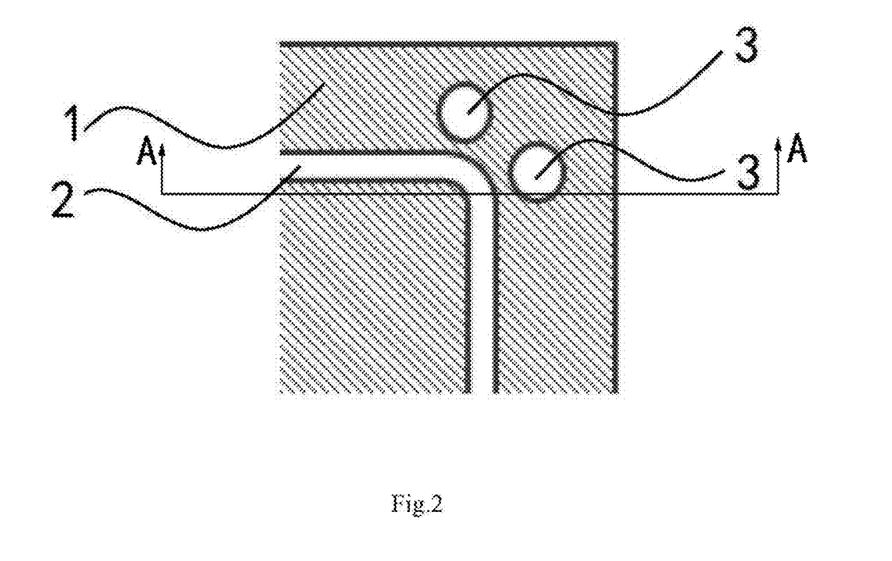
FIG. 2 is a schematic structural view showing a display panel having a second connection structure according to an exemplary implementation.
Figure 2A:
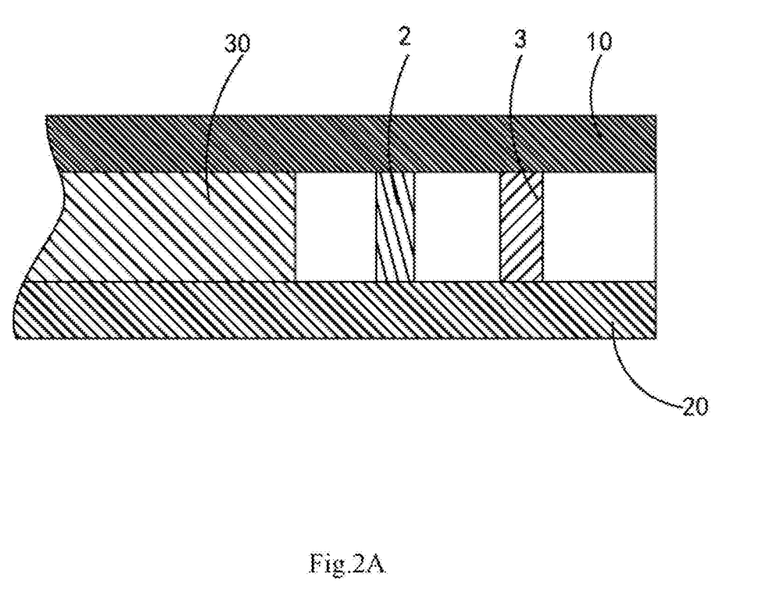
FIG. 2A is a cross-sectional view of the display panel of FIG. 2 taken along the lines A-A of FIG. 2.
Figure 3:
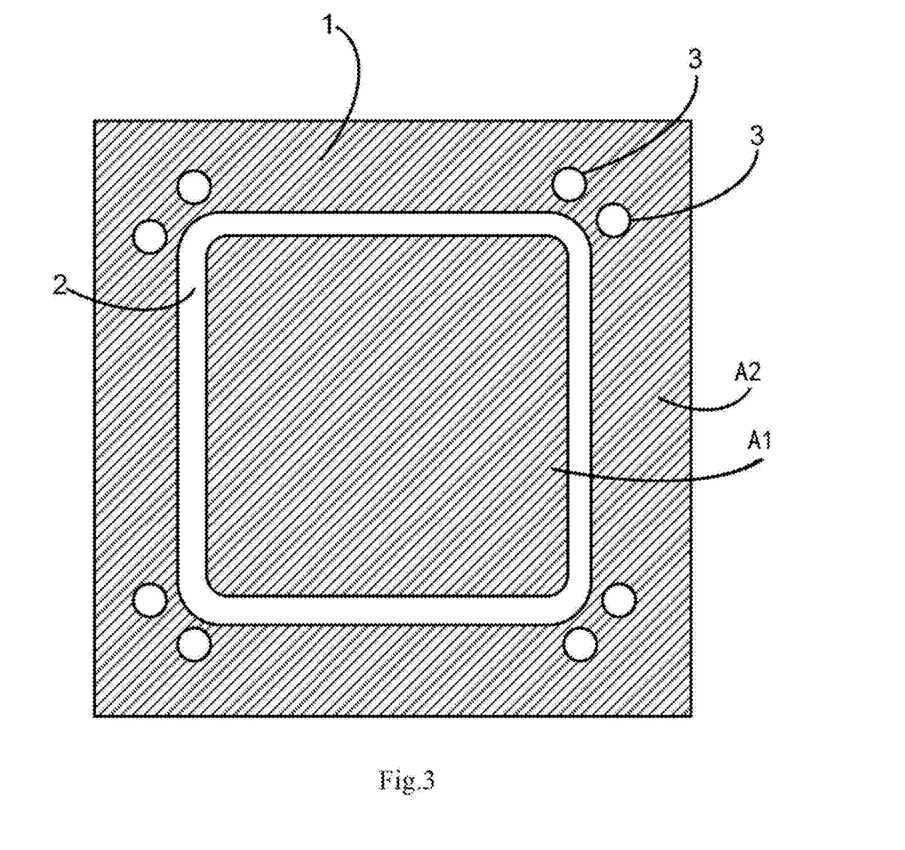
FIG. 3 is a schematic structural view showing a display panel having a plurality of second connection structures according to another exemplary implementation.
Figure 4:
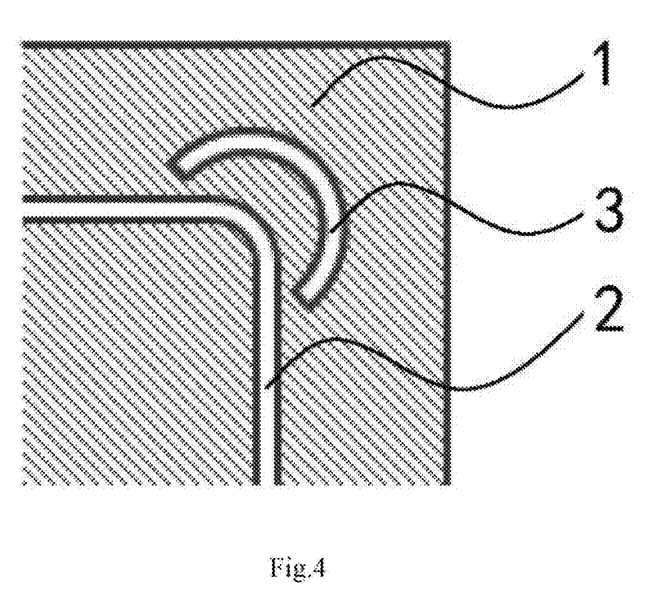
FIG. 4 is a schematic structural view showing a display panel having a second connection structure according to another exemplary implementation.
Figure 5:
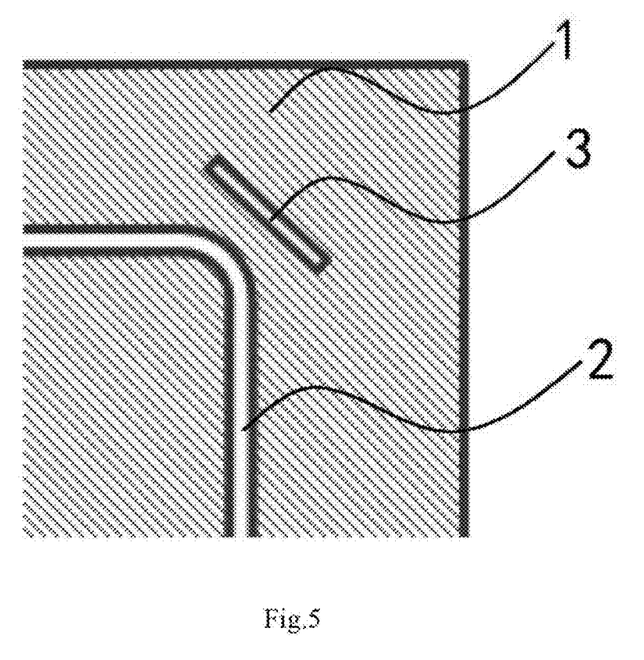
FIG. 5 is a schematic structural view showing a display panel having a second connection structure according to a further exemplary implementation.
Figure 6:
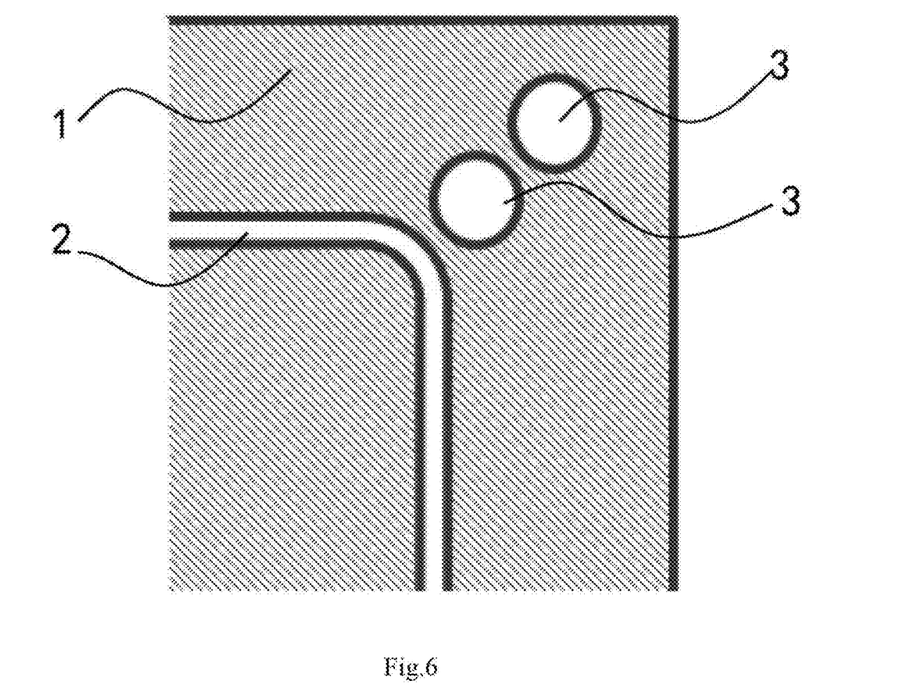
FIG. 6 is a schematic structural view showing a display panel having a second connection structure according to a further exemplary implementation.

FIG. 1 is a schematic structural view of a display panel in the prior art. FIG. 2 is a schematic structural view showing a display panel having a second connection structure according to an exemplary implementation. FIG. 2A is a cross-sectional view of the display panel of FIG. 2 taken along the lines A-A of FIG. 2. FIG. 3 is a schematic structural view showing a display panel having a plurality of second connection structures according to another exemplary implementation. FIG. 4 is a schematic structural view showing a display panel having a second connection structure according to another exemplary implementation. FIG. 5 is a schematic structural view showing a display panel having a second connection structure according to a further exemplary implementation. FIG. 6 is a schematic structural view showing a display panel having a second connection structure according to a further exemplary implementation.

According to one specific implementation of this disclosure, a display panel may be an OLED panel, a first substrate may be an array substrate of the OLED panel, and a second substrate may be a cover plate of the OLED panel.

Referring to FIGS. 2 and 2A, one aspect according to the present disclosure provides a display panel, wherein the display panel may include a first substrate 10, a second substrate 20, an OLED device 30, a first connection structure 2, and a second connection structure 3. The first substrate 10 and the second substrate 20, which are bonded with each other as defined in the present disclosure, may be called as a glass substrate 1. The glass substrate 1 may include a display area A1 and a peripheral area A2 around the display area. According to one specific implementation of the present disclosure, the second substrate 20 may be arranged opposite to the first substrate 10, and the display areas A1, A2 may be arranged at the corresponding positions of the first substrate and the second substrate, respectively. According to one specific implementation of the present disclosure, the OLED device 30 may be arranged between the second substrate 20 and the first substrate 10, and the OLED device may be positioned within the display area A1 of the first substrate and the second substrate. According to one specific implementation of the present disclosure, the first connection structure 2 may be arranged between the second substrate 20 and the first substrate 10, and connect the second substrate with the first substrate. According to one specific implementation of the present disclosure, the first connection structure 2 may be arranged in the peripheral area A2 to surround the OLED device 30 so as to seal the OLED device inside the glass substrate 1 to prevent water vapor and oxygen from corroding the OLED device.

In the prior art, a resin adhesive material is generally used to package the OLED device. However, because of limitation of the adhesiveness between the glass substrate 1 and the resin adhesive material, loosen adhesive usually occurs in the glass substrate 1, particularly in the corner portion of the glass substrate 1, during cutting, processing, conveying or assembling of the display panel.

According to one specific implementation of the present disclosure, the display panel may further comprise a second connection structure 3. The second connection structure 3 may be arranged between the first substrate and the second substrate and connect and fix the first substrate and the second substrate. As shown in FIG. 3, the second connection structures 3 may be plurality and arranged separately from each other. The second connection structures 3 employ separating arrangement to avoid stress concentration happened in the second connection structure 3 so as to protect the glass substrate 1 from being torn. According to one specific implementation of the present disclosure, the second connection structure 3 may be located in the peripheral area and far away from the display area than the first connection structure 2, so as to reinforce connection between the first substrate and the second substrate again and prevent the first connection structure 3 from loosing the adhesive.

Referring to FIG. 2 to FIG. 6, according to one implementation of the present disclosure, the second connection structure 3 may be a glass adhesive. Conventionally, tearing damage of the glass substrate 1 will be caused due to too large stress when the glass adhesive is used to bond the glass substrate, so that those skilled in the art usually employ the resin adhesive materials to package the OLED device but avoid using the glass adhesive. Thereby, it has been expected that package of the OLED device by using the glass adhesive is not allowable. The inventor of the present disclosure, who broke through the traditional thinking and overcome the above technical prejudice, secures the glass substrate 1 by combination of the glass adhesive and the resin adhesive material, which prevents the resin adhesive material from loosing adhesive, and also avoid tearing damage of the glass substrate 1. Particularly, the first connection structure 2 may be arranged around the OLED device such that the OLED device is packaged within the display area of the glass substrate 1. In addition, the second connection structure 3 may be arranged at the periphery of the first connection structure 2 with interspace. For example, but not limited hereto, the first connection structure 2 may be made of resin adhesive materials, and the second connection structure 3 may be made of the glass adhesive, and other adhesive materials capable of bonding may also be contained within the protection scope of this disclosure. According to one implementation of the present disclosure, the materials of the second connection structure 3 may include at least one of silicone adhesive and urethane adhesive.

Referring to FIG. 2 to FIG. 6, according to one implementation of the present disclosure, a shape of the first connection structure 2 orthographic projected on the first substrate may have a closed and approximately rectangular structure, but not limited thereto. The first connection structure 2 may be typically arranged around the OLED device. The first connection structure 2 has a shape that can be selected based on the structural shape of the OLED device, but all of the shapes are contained in the protection scope of the present disclosure. According to one specific implementation of the present disclosure, the second connection structure 3 may be arranged at the corner or at the periphery of the corner of the first connection structure 2. According to one specific implementation of the present disclosure, the second connection structure 3 and the corner may be arranged separately from each other, but not limited thereto. The second connection structure 3 may be coated any position at the periphery of the first connection structure 2 according to actual situations.

Further referring to FIG. 4 to FIG. 5, according to one implementation of the present disclosure, the shape of the second connection structure 3 orthographic projected on the first substrate may have a non-closed linear structure so as to be able to disperse the stress well.

As shown in FIG. 4, according to one implementation of the present disclosure, the shape of the second connection structure 3 orthographic projected on the first substrate may have an arc-shaped structure. The arc-shaped structure has a circular center located at a corner of the first connection structure 2 corresponding to the arc-shaped structure, a radius of about 3-5 mm and a width of about 1-3 mm. According to one specific implementation of the present disclosure, the arc-shaped structure may be a part of a circle with a radius of about 3 mm, where the circle has the circular center that may be located near to the corner of the first connection structure 2, all of which are contained within the protection scope of the present disclosure. According to one specific implementation of the present disclosure, the arc-shaped structure may be about ¾ of a circle, about ¼ of a circle, or a semicircular structure, all of which are contained within the protection scope of the present disclosure.

Further referring to FIG. 5, according to one implementation of the present disclosure, the shape of the second connection structure 3 orthographic projected on the first substrate may also has a line segment structure with a length of about 3-5 mm and a width of about 1-2 mm. A diagonal line between the two corners opposite to each other of the first connection structure 2 is perpendicular to an extending direction of the line segment structure corresponding to the two corners. A straight line where the diagonal line between the two corners opposite to each other of the first connection structure 2 is located passes through the centers of the line segment structures corresponding to the two corners. According to one specific implementation of the present disclosure, the line segment structure may extend along a diagonal line direction at the corner of the rectangular structure. According to one specific implementation of the present disclosure, the extending direction of the line segment structure may be perpendicular to the extending direction of the diagonal line at the corner corresponding to the line segment structure. The center of the line segment structure may be located on the straight line where the diagonal line at the corresponding corners of the first connection structures 2 is located, but not limited thereto. Those skilled in the art may select the angle between the line segment structure and the diagonal line at the corresponding corners of the first connection structures 2 according to actual situations, for example, but not limited to, the angle may be about 75-90°.

Further referring to FIG. 2, according to one implementation of the present disclosure, the shape of the second connection structure 3 orthographic projected on the first substrate may further include a plurality of circular structures arranged separately from each other. The circular centers of the plurality of circular structures may be on the same straight line. According to one implementation of the present disclosure, the straight line where the circular centers of the circular structures are located is parallel to the diagonal line at the corners of the first connection structures 2 corresponding to the circular structures. According to one implementation of the present disclosure, a straight line where the circular centers of the circular structures are located may be perpendicular to a diagonal line at the corners of the first connection structure 2 corresponding to the circular structures. According to one implementation of the present disclosure, the diameter of the circular structure may be about 1 mm, and the distance between the circular centers of the adjacent circular structures may be about 2 mm. According to one specific implementation of the present disclosure, the circular structures may be arranged in the diagonal line direction of the rectangular structure, but not limited thereto, and the inclination angle can be selected according to actual situations.

According to one specific implementation of the present disclosure, ratio of the distance from the center of the line segment formed by connection line of the circle centers of the plurality of circular structures to the corner of the first connection structure 2 corresponding to the circular structures to a sum of a length of the line segment and the radii of the two circular structures located on the both ends of the line segments may be about ⅙ to 1.

Another aspect according to the present disclosure provides a display device, including a display panel provided by the present disclosure.

According to the above technical solutions, the display panel and the display device provided by the present disclosure have the advantages and positive effects that the display panel of the present disclosure includes a first connection structure for packaging the OLED device and a second connection structure arranged at the periphery of the first connection structure, to reinforce bonding of the first connection structure and prevent locally loosen adhesive of the first connection structure. Furthermore, to the person skilled in the art, it has been supposed that the glass substrate occurs cracks always as result of action of the internal stress when the glass adhesive is used to package the OLED device, so that the technical solution of employing the glass adhesive to package the OLED device has been abandoned. However, the present disclosure overcomes the technical prejudice, but discloses the technical solution that combination of the glass adhesive and the resin adhesive is used to package the OLED device, to solve the problem of loosing adhesive but also not lead to appearance of the cracks. Furthermore, the glass adhesive is applied on the periphery of the corners of the first connection structure so as to secure the corners of the first connection structure to prevent the glass substrates bonded to one another from being separated due to loosen adhesive. Further, the glass adhesive may be in the shape with stress dispersion, for example but not limited to a circular shape, a circular arc shape or a linear shape. Therefore, the technical solution can overcome the problem that the glass substrate occurs cracks resulting from the glass substrate bonded by using the glass adhesive, and can prolong the service life of the glass substrate.

The features, structures, or properties described herein may be incorporated into one or more implementations in any suitable manner. In the above description, numerous specific details are provided to provide a thorough understanding of embodiments of the present disclosure. However, those skilled in the art will realize that the aspects of the disclosure may be practiced without one or more specific details or by means of other methods, components and materials, etc. Under the other circumstances, well-known structures, materials, or operations are not shown or described in detail to avoid obscuring variable aspects of the disclosure.

What is claimed is:
1. A display panel, comprising:
a first substrate;
a second substrate, arranged opposite to the first substrate,
a display area, a peripheral area around the display area, an Organic Light-Emitting Diode (OLED) device, arranged between the second substrate and the first substrate, wherein the OLED device is arranged in the display area, a first connection structure, arranged between the second substrate and the first substrate and connected with the second substrate and the first substrate, wherein the first connection structure is located at the peripheral area to surround the OLED device, and a second connection structure, arranged between the second substrate and the first substrate and connected with the second substrate and the first substrate, wherein the second connection structure is located at the peripheral area and farther away from the display area than the first connection structure, wherein a shape of the first connection structure orthographically projected onto the first substrate is a closed and approximately rectangular structure, and the second connection structure is arranged at a corner or at a periphery of the corner of the first connection structure, wherein a shape of the second connection structure orthographically projected onto the first substrate is a non-closed linear structure, wherein the shape of the second connection structure orthographically projected onto the first substrate is an arc-shaped structure, which has a circular center located at the corner of the first connection structure corresponding to the arc-shaped structure, a radius of 3-5 mm, and a width of 1-3 mm.

2. The display panel according to claim 1, wherein the shape of the second connection structure orthographically projected onto the first substrate is a line segment structure with a length of 3-5 mm and a width of 1-2 mm, and a diagonal line between two corners opposite to each other of the first connection structure is perpendicular to an extending direction of the line segment structure corresponding to the two corners, and a straight line where the diagonal line between two corners opposite to each other of the first connection structures is located passes through a center of the line segment structure corresponding to the two corners.

3. The display panel according to claim 1, wherein there are a plurality of the second connection structures and the second connection structures are arranged separately from each other, and wherein the second connection structures are glass adhesives.

4. The display panel according to claim 3, wherein the materials of the glass adhesives comprise at least one of silicone adhesive and polyurethane adhesive.

5. A display device, comprising a display panel, the display panel comprises:

a first substrate;

a second substrate, arranged opposite to the first substrate, a display area, a peripheral area around the display area, an OLED device, arranged between the second substrate and the first substrate, wherein the OLED device is arranged in the display area, a first connection structure, arranged between the second substrate and the first substrate and connected with the second substrate and the first substrate, wherein the first connection structure is located at the peripheral area to surround the OLED device, and a second connection structure arranged between the second substrate and the first substrate and connected with the second substrate and the first substrate, wherein the second connection structure is located at the peripheral area and farther away from the display area than the first connection structure, wherein a shape of the first connection structure orthographically projected onto the first substrate is a closed and approximately rectangular structure, and the second connection structure is arranged at a corner or at a periphery of the corner of the first connection structure, wherein a shape of the second connection structure orthographically projected onto the first substrate is a non-closed linear structure, wherein the shape of the second connection structure orthographically projected onto the first substrate is an arc-shaped structure, which has a circular center located at the corner of the first connection structure corresponding to the arc-shaped structure, a radius of 3-5 mm, and a width of 1-3 mm.

6. The display panel according to claim 5, wherein the shape of the second connection structure orthographically projected onto the first substrate is a line segment structure with a length of 3-5 mm and a width of 1-2 mm, and a diagonal line between two corners opposite to each other of the first connection structure is perpendicular to an extending direction of the line segment structures corresponding to the two corners, and a straight line where the diagonal line between two corners opposite to each other of the first connection structure is located passes through a center of the line segment structure corresponding to the two corners.

7. The display panel according to claim 5, wherein there are a plurality of the second connection structures and the second connection structures are arranged separately from each other, and wherein the second connection structures are glass adhesives.

* * * * *